United States Patent
Ishigami et al.

(10) Patent No.: US 9,676,066 B2
(45) Date of Patent: Jun. 13, 2017

(54) ANISOTROPIC CONDUCTIVE ADHESIVE

(71) Applicant: DEXERIALS CORPORATION, Tokyo (JP)

(72) Inventors: Akira Ishigami, Tochigi (JP); Shiyuki Kanisawa, Tochigi (JP); Hidetsugu Namiki, Tochigi (JP); Masaharu Aoki, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/423,887

(22) PCT Filed: Sep. 17, 2013

(86) PCT No.: PCT/JP2013/075048
§ 371 (c)(1),
(2) Date: Feb. 25, 2015

(87) PCT Pub. No.: WO2014/046093
PCT Pub. Date: Mar. 27, 2014

(65) Prior Publication Data
US 2015/0209914 A1    Jul. 30, 2015

(30) Foreign Application Priority Data
Sep. 24, 2012  (JP) ................. 2012-210224

(51) Int. Cl.
*H01L 23/532*    (2006.01)
*B23K 35/36*    (2006.01)
(Continued)

(52) U.S. Cl.
CPC ............ *B23K 35/36* (2013.01); *B23K 1/0016* (2013.01); *B23K 35/025* (2013.01); *B23K 35/24* (2013.01);
(Continued)

(58) Field of Classification Search
None
See application file for complete search history.

(56) References Cited

U.S. PATENT DOCUMENTS 5,120,665 A * 6/1992 Tsukagoshi ........... H01L 21/563
156/64
5,770,305 A * 6/1998 Terasaka .................. H01B 1/22
252/518.1

(Continued)

FOREIGN PATENT DOCUMENTS

JP    S60-178690 A    9/1985
JP    S64-59786 A    3/1989
(Continued)

OTHER PUBLICATIONS

Mar. 24, 2015 International Preliminary Report on Patentability issued in International Application No. PCT/JP2013/075048.
(Continued)

Primary Examiner — Benjamin Sandvik
(74) Attorney, Agent, or Firm — Oliff PLC

(57) ABSTRACT

An anisotropic conductive adhesive in which high thermal dissipation is provided. Conductive particles and solder particles are dispersed in a binder. In a thermally compressed LED device manufactured using this anisotropic conductive adhesive, terminals of the LED device are electrically connected to terminals of a substrate via particles and the terminals of the LED device and the terminals of the substrate are solder bonded.

5 Claims, 6 Drawing Sheets

(51) Int. Cl.
*C09J 9/02* (2006.01)
*H01B 1/22* (2006.01)
*H01L 33/62* (2010.01)
*C09J 11/00* (2006.01)
*B23K 1/00* (2006.01)
*B23K 35/02* (2006.01)
*B23K 35/24* (2006.01)
*H05K 3/34* (2006.01)
*H05K 13/04* (2006.01)
*C08K 9/02* (2006.01)
*H01L 23/373* (2006.01)
*H01L 23/00* (2006.01)

(52) U.S. Cl.
CPC .............. *C09J 9/02* (2013.01); *C09J 11/00* (2013.01); *H01B 1/22* (2013.01); *H01L 23/5328* (2013.01); *H01L 24/29* (2013.01); *H01L 33/62* (2013.01); *H05K 3/3484* (2013.01); *H05K 13/0465* (2013.01); *C08K 9/02* (2013.01); *C08K 2201/001* (2013.01); *H01L 23/3737* (2013.01); *H01L 24/05* (2013.01); *H01L 24/06* (2013.01); *H01L 24/13* (2013.01); *H01L 24/16* (2013.01); *H01L 24/32* (2013.01); *H01L 24/81* (2013.01); *H01L 2224/0401* (2013.01); *H01L 2224/06102* (2013.01); *H01L 2224/16238* (2013.01); *H01L 2224/1703* (2013.01); *H01L 2224/17051* (2013.01); *H01L 2224/293* (2013.01); *H01L 2224/2919* (2013.01); *H01L 2224/32225* (2013.01); *H01L 2224/48091* (2013.01); *H01L 2224/49107* (2013.01); *H01L 2224/73204* (2013.01); *H01L 2224/73265* (2013.01); *H01L 2224/81193* (2013.01); *H01L 2224/81805* (2013.01); *H01L 2224/81903* (2013.01); *H01L 2224/8385* (2013.01); *H01L 2224/83851* (2013.01); *H01L 2224/9211* (2013.01); *H01L 2924/01322* (2013.01); *H01L 2924/07811* (2013.01); *H01L 2924/12041* (2013.01); *H01L 2924/15787* (2013.01)

(56) References Cited

U.S. PATENT DOCUMENTS

| | | | | |
|---|---|---|---|---|
| 5,965,064 | A * | 10/1999 | Yamada | C09J 9/02 174/259 |
| 6,311,888 | B1 * | 11/2001 | Funada | B32B 27/20 228/106 |
| 2004/0012098 | A1 * | 1/2004 | Yamazaki | C09J 7/02 257/778 |
| 2009/0229123 | A1 | 9/2009 | Sakai et al. | |
| 2010/0203675 | A1 * | 8/2010 | Nakatani | H01L 21/563 438/108 |
| 2011/0108878 | A1 * | 5/2011 | Namiki | C09J 9/02 257/99 |
| 2013/0213691 | A1 * | 8/2013 | Park | H01B 3/082 174/126.4 |

FOREIGN PATENT DOCUMENTS

| | | |
|---|---|---|
| JP | H03-129607 A | 6/1991 |
| JP | H04-180029 A | 6/1992 |
| JP | H06-187834 A | 7/1994 |
| JP | H08-186156 A | 7/1996 |
| JP | H11-4064 A | 1/1999 |
| JP | H11-176879 A | 7/1999 |
| JP | H11-245082 A | 9/1999 |
| JP | 2006-108523 A | 4/2006 |
| JP | 2008-072038 A | 3/2008 |
| JP | 2013-118180 A | 6/2013 |
| JP | 2013-118181 A | 6/2013 |

OTHER PUBLICATIONS

Dec. 3, 2013 International Search Report issued in International Patent Application No. PCT/JP2013/075048.

* cited by examiner

ANISOTROPIC CONDUCTIVE ADHESIVE

FIELD OF THE INVENTION

The present invention relates to an anisotropic conductive adhesive having conductive particles dispersed therein and, more particularly, to an anisotropic conductive adhesive which can dissipate heat generated by an LED (Light Emitting Diode) among other chips (devices).

This application claims priority to Japanese Patent Application No. 2012-210224 filed on Sep. 9, 2012, the entire content of which is hereby incorporated by reference.

DESCRIPTION OF PRIOR ART

A conventional method of mounting an LED device to a substrate uses a wire bonding method. As illustrated in FIG. 6, in the wire bonding method, an electrode of an LED device (first conductive electrode 104a and second conductive electrode 102a) is faced upward (face-up), the LED device and a substrate are electrically connected with a wire bond (WB) 301a and 301b, and the LED device is adhered to the substrate using a die bond material 302.

However, in an electrical connection using such wire bonding, there is a risk of the wire bond fracturing or detaching from the electrode (first conductive electrode 104a and second conductive electrode 102a) thus more reliable techniques are sought. Furthermore, hardening processes of the die bond material 302 are performed by oven hardening which increases production time.

As illustrated in FIG. 7, there is a method in which wire bonding is not used wherein an electrode (first conductive electrode 104a and second conductive electrode 102a) of an LED device is faced towards the substrate (face-down, flip-chip), and the LED device and the substrate are electrically connected using a conductive paste 303a, 303b of which silver paste is an example.

However, as the adhesive strength of the conductive paste 303a, 303b is weak, reinforcement with a sealing resin 304 is necessary. Furthermore, hardening processes of the sealing resin 304 are performed by oven hardening which increases production time.

As illustrated in FIG. 8, a method exists in which conductive paste is not used wherein an electrode of an LED device is faced towards a substrate (face-down, flip-chip) and conductive particles 306 are dispersed in an electrically insulating adhesive binder 305 to form an anisotropic conductive adhesive used to electrically connect and adhere the LED device to a substrate. A method using anisotropic conductive adhesive has favorable productivity because bonding processes thereof are short in duration. Additionally, anisotropic conductive adhesive is low in cost and has excellent transparency, adhesive, thermal resistance, mechanical strength, and electrical insulation properties.

Additionally, in recent years, LED devices for flip-chip mounting are being developed. A passivation layer 105 makes possible an electrode with a large surface area enabling bumpless mounting of a flip-chip-mounting LED device. Furthermore, placing a reflective layer under an emission layer of an LED device increases light extraction efficiency.

As illustrated in FIG. 9, a gold-tin eutectic bonding is used in a mounting process wherein a flip-chip-mounting LED device is mounted to a substrate. The gold-tin eutectic bonding is a method of eutectic bonding between an electrode and a substrate wherein a chip electrode is manufactured from a gold-tin alloy 307, a flux is applied to a substrate, the chip is mounted to the substrate, and heat is applied to form a eutectic bond between the electrode and the substrate. However, in such soldering methods, yield rates are poor because chip misalignment and flux remaining after cleaning adversely affect reliability. Furthermore, advanced mounting technology is necessary.

As illustrated in FIG. 10, an existing method in which gold-tin eutectic bonding is not used is a solder connection method wherein solder paste is used to create an electrical connection between an LED device and a substrate. However, in such solder connection methods, due to the solder paste being isotropic, yield rates are poor because short circuits in p-n junctions are generated.

In a method that does not use solder paste, as illustrated in FIG. 11, an LED device is electrically connected and adhered to a substrate in the same manner as illustrated in FIG. 8 wherein conductive particles are dispersed in an electrically insulating adhesive binder to form an anisotropic conductive adhesive, for example, an anisotropic conductive film (ACF), among others. In such a process using anisotropic conductive adhesive, p-n junctions are filled with an electrically insulating binder. Consequently, yield rates are favorable because short circuits are not easily generated. Furthermore, productivity is favorable because bonding processes thereof are short in duration.

However, an active layer (junction) 103 of an LED device, in addition to light, generates much heat and if temperature thereof (Tj=junction temperature) is 100° C. or more, light production efficiency and service life of the LED device are reduced. Consequently, a structure to efficiently disperse heat from the active layer 103 is necessary.

Heat dispersal is poor in the wire bonding mounting illustrated in FIG. 6 because heat generated by the active layer 103 is not efficiently transferred towards the substrate side because the active layer 103 is located above the LED device.

Additionally, if such a flip-chip mounting as illustrated in FIGS. 7, 9 and 10 is performed, heat is efficiently transferred towards the substrate side from the active layer 103 because the active layer 103 is located on the substrate side. As illustrated in FIGS. 7 and 10, in the case of electrodes being joined by the conductive paste 303a, 303b, heat can be efficiently dispersed; however, connections made using the conductive paste 303a, 303b have poor reliability as previously described. Furthermore, as illustrated in FIG. 9, in the case of gold-tin eutectic bonding being performed, connections have poor reliability as previously described.

Additionally, as illustrated in FIGS. 8 and 11, in the cases in which the conductive paste 303a, 303b are not used and ACF (Anisotropic Conductive Film), ACP (Anisotropic Conductive Paste) and/or other anisotropic conductive adhesives are used for flip-chip mounting, the active layer 103 is proximally located to the substrate and heat is efficiently transferred to the substrate side. Additionally, high adhesive strength enables high connection reliability.

CITATION LIST

Prior Art Documents

Patent Literatures

PLT 1: Japanese Unexamined Patent Application Publication No. 1999-4064
PLT 2: Japanese Unexamined Patent Application Publication No. 1985-178690

PLT 3: Japanese Unexamined Patent Application Publication No. 1999-176879

PLT 4: Japanese Unexamined Patent Application Publication No. 1996-186156

SUMMARY OF THE INVENTION

Problem to be Solved by the Invention

However, due to thermal conductivity of conventional anisotropic conductive adhesives in a cured state being approximately 0.2 W/(m·K), adequate transfer of heat from an LED device to a side facing a substrate has not been possible. Additionally, in flip-chip mounting using an anisotropic conductive adhesive, heat dissipation is poor because the only route for heat transmission is conductive particles of electrically connected parts.

In view of the foregoing, the object of this invention is to provide an anisotropic conductive adhesive capable of providing good heat dissipation properties.

Means for Solving the Problem

As a result of extensive studies, the inventors of the present invention have found that a combination of conductive particles, each of which being a resin particle having a conductive metallic layer formed upon the surface thereof, and solder particles enables achievement of the aforementioned objective.

Thus, an anisotropic conductive adhesive according to the present invention includes conductive particles, each being a resin particle having a conductive metallic layer formed on the surface thereof; solder particles; and an adhesive agent material in which the conductive particles and the solder particles are dispersed.

Additionally, a connective structure according to the present invention comprises conductive particles, each being a resin particle having a conductive metallic layer formed on the surface thereof, electrically connecting a terminal of a first electronic component and a terminal of a second electronic component, wherein the terminal of the first electronic component and the terminal of the second electronic component are solder bonded.

Effects of the Invention

According to the present invention, because, during crimping, the conductive particles undergo a flattening deformation due to pressure and the solder particles are solder joined due to a crushing deformation, area of contact with the opposing terminal is increased thus enabling a high level of heat dissipation.

DESCRIPTION OF EMBODIMENTS

Embodiments of this invention will now be described in detail according to the following order with reference to the attached drawings.
1. Anisotropic Conductive Adhesive and Manufacturing Method Thereof
2. Connective Structure and Manufacturing Method Thereof
3. Examples <1. Anisotropic Conductive Adhesive and Manufacturing Method Thereof>

An anisotropic conductive adhesive according to this embodiment is a binder (an adhesive agent material) in which conductive particles, each of which being a resin particle with a conductive metallic layer formed upon the surface thereof, and solder particles have been dispersed; the form of this combination is a paste or a film, among other forms, and the form may be chosen according to intended use.

Figure 1:
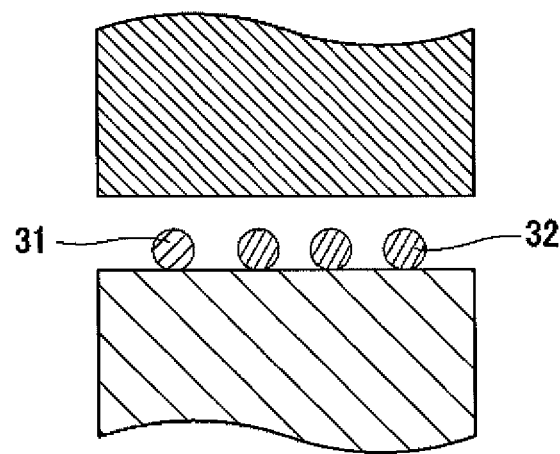
FIG. 1 is a schematic cross-sectional view illustrating opposing terminals before crimping.
Figure 2:
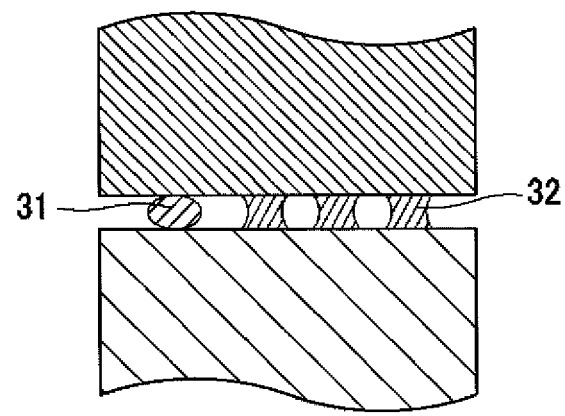
FIG. 2 is a schematic cross-sectional view illustrating opposing terminals after crimping.

FIGS. 1 and 2 are schematic cross-sectional views of opposing terminals before and after crimping respectively. In this embodiment, it is possible to insert the conductive particles 31 and the solder particles 32 between terminals before crimping by forming the anisotropic conductive adhesive into a structure which will be described below. Subsequently, upon crimping, the conductive particles 31, each of which is made from a resin particle as a core undergo a flattening deformation to produce elastic rebound against the deformation, thus keeping electrical connection. Additionally, upon crimping and while the conductive particles are undergoing the flattening deformation, the solder particles 32 are also crushed and, due to solder bonding caused by heating, form a metallic bond which increases contact area with terminals thus improving heat dissipation and electrical properties. Furthermore, the conductive particles, which have a resin core, mitigate stress generated by a difference in thermal expansion between a device and a substrate which prevents cracks in solder bonded parts and thus connection reliability can be improved.

The conductive particle may be a resin particle manufactured from an epoxy resin, a phenol resin, an acrylic resin, an acrylonitrile-styrene (AS) resin, a benzoguanamine resin, a divinylbenzene based resin, or a styrene based resin among other resins and is covered with a metallic layer of Au, Ni, and/or Zn to form a metal-coated conductive particle. Because this metal-coated particle is easily crushable and deformable upon crimping, a large contact area to a wiring pattern is possible and unevenness in height of the wiring pattern can be accommodated.

Additionally, in view of connection reliability and electrical insulation properties, the conductive particles are preferably included at 1 to 30% by volume relative to the binder. Additionally, the average diameter of the conductive particles (D50) is preferably 1 to 10 μm and more preferably 2 to 6 μm.

Solder particles are, for example, as defined in JISZ 3282-1999, Sn—Pb based, Pb—Sn—Sb based, Sn—Sb based, Sn—Pb—Bi based, Bi—Sn based, Sn—Cu based, Sn—Pb—Cu based, Sn—In based, Sn—Ag based, Sn—Pb—Ag based, or Pb—Ag based, among others, and may be chosen according to connection conditions, terminal material, and other considerations. Additionally, the form of the solder particles can be chosen from among a granular form, a scaly form, or other forms. It should be noted that, to improve anisotropic properties, the solder particles may be covered with an electrically insulating layer.

The preferable blending amount of the solder particles is 1 to 30% by volume. An insufficient volume of the solder particles adversely affects heat dissipation properties and an excessive volume of the solder particles adversely affects anisotropic properties and connection reliability.

Additionally, the average diameter (D50) of the solder particles is preferably 25 to 400% of the average diameter of the conductive particles. If the solder particles are too small in comparison with the conductive particles, the solder particles will not be held in place by the opposing terminal during crimping which leads to satisfactory solder bonding not taking place thus making excellent heat dissipation properties unobtainable. On the contrary, if the solder particles are too large in comparison with the conductive particles, anisotropic properties are lost and reliable connection properties are unobtainable.

It is possible to use adhesive compositions used in conventional anisotropic conductive adhesives and anisotropic conductive films as the binder. Examples of preferable adhesive compositions are curable epoxy adhesive agents containing alicyclic epoxy compounds, heterocyclic epoxy compounds, and hydrogenated epoxy compounds, among others as primary ingredients thereof.

An example of a preferable heterocyclic epoxy compound is a compound intramolecularly having 2 or more epoxy groups. The aforementioned compounds may be in liquid or solid state. In particular, examples include glycidyl hexahydro bisphenol A, and 3,4-epoxycyclohexenyl methyl-3',-4'-epoxycyclohexene carboxylate, among others. Among the aforementioned epoxy compounds, 3,4-epoxycyclohexylmethyl 3', 4'-epoxycyclohexanecarboxylate may preferably be used because this has an excellent rapid curing property and ensures optical transparency appropriate for mounting an LED device after curing.

Examples of heterocyclic-based compounds include a triazine-ring containing epoxy compound and an especially preferable example is 1,3,5-tris(2,3-epoxypropyl)-1,3,5-triazine-2,4,6-(1H,3H,5H)-trione.

As a hydrogenated epoxy compound, hydrogenated compounds of the aforementioned alicyclic epoxy compounds, hetero-ring-based epoxy compounds, and other known hydrogenated epoxy resins may be used.

Alicyclic epoxy compounds, hetero-ring-based epoxy compounds, and hydrogenated epoxy compounds may be used individually or in a combination of two or more. Furthermore, in addition to the aforementioned epoxy compounds and to the extent that the effects of this invention are not adversely affected, other epoxy compounds may be used. Examples of other epoxy compounds include glycidyl ethers obtained by reacting epichlorohydrin with polyhydric phenols including bisphenol A, bisphenol F, bisphenol S, tetramethyl bisphenol A, diallyl bisphenol A, hydroquinone, catechol, resorcinol, cresol, tetrabromobisphenol A, trihydroxybiphenyl, benzophenone, bisresorcinol, bisphenol hexafluoroacetone, tetramethyl bisphenol A, tetramethyl bisphenol F, tris(hydroxyphenyl)methane, bixylenol, phenolic novolac, cresol novolac; polyglycidyl ethers obtained by reacting epichlorohydrin with polyhydric aliphatic alcohols including glycerin, neopentyl glycol, ethylene glycol, propylene glycol, hexylene glycol, polyethylene glycol, polypropylene glycol; glycidyl ether esters obtained by reacting epichlorohydrin with hydroxycarboxylic acids such as p-hydroxybenzoate and β-oxynaphthoic acid; polyglycidyl esters obtained from polycarboxylic acid such as phthalic acid, methylphthalic acid, isophthalic acid, terephthalic acid, tetrahydrophthalic acid, endomethylene tetrahydrophthalic acid, endomethylene hexahydrophthalic acid, trimellitic anhydride and polymerized fatty acids; amino glycidyl ethers obtained from aminophenol, glycidyl and aminoalkyl phenol; glycidyl amino glycidyl esters obtained from aminobenzoic acids; glycidyl amines obtained from aniline, toluidine, tribromoaniline, xylylenediamine, diaminocyclohexane, bis(aminomethyl)cyclohexane, 4,4'-diaminodiphenylmethane and 4,4'-diaminodiphenylsulfone; and epoxidized polyolefin-based epoxy resins among other known epoxy resins.

Examples of curing agents include acid anhydrides, imidazole compounds, and dicyan, among others. Among the aforementioned curing agents, use of agents which do not easily cause color changes in a cured product, especially alicyclic acid anhydride based curing agents, is preferable. In particular, preferable examples include methylhexahydrophthalic anhydride, among others.

Regarding an adhesive composition, in the cases of using an alicyclic epoxy compound and an alicyclic acid anhydride based curing agent, in respect to amounts of each to be used, because insufficient amounts of the alicyclic acid anhydride based curing agent leads to excessive uncured epoxy compound and excessive amounts of the alicyclic acid anhydride based curing agent tends to promote corrosion of adherends as an effect of remaining curing agent, with respect to 100 parts by mass of the alicyclic epoxy compound, 80 to 120 parts by mass of the alicyclic acid anhydride based curing agent is preferably used and 95 to 105 parts by mass of it is more preferably used.

Such an anisotropic conductive adhesive ensures an excellent heat dissipation property and high connection reliability because conductive particles thereof undergo a flattening deformation during crimping due to pressure and solder particles thereof are crushed and form a metallic bond due to solder bonding caused by heat.

Additionally, it is possible to manufacture the anisotropic conductive adhesive according to this embodiment by uniformly mixing an adhesive composition, conductive particles, and solder particles.

<2. Connective Structure and Manufacturing Method Thereof>

A connective structure made using the aforementioned anisotropic conductive adhesive will now be explained. A connective structure according to this embodiment comprises conductive particles, each being a resin particle having a conductive metallic layer formed on the surface thereof, electrically connecting a terminal of a first electronic component and a terminal of a second electronic component, the terminal of the first electronic component and the terminal of the second electronic component are solder bonded, and solder particles having an average diameter smaller than that of the conductive particles are trapped between the terminal of the first electronic component and the terminal of the second electronic component.

Preferable electronic components in this embodiment include driver ICs(Integrated Circuit) and LEDs (Light Emitting Diode), among other chips (devices).

Figure 3:
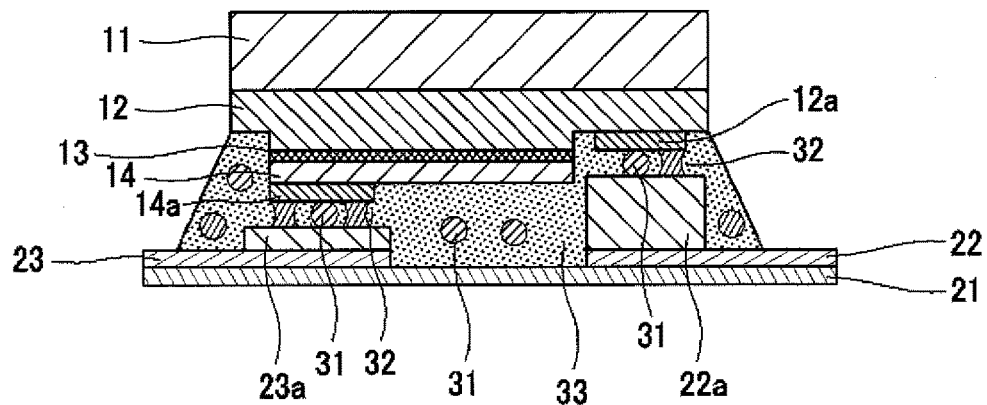
FIG. 3 is a cross-sectional view of an example of an LED package according to one embodiment of the present invention.

FIG. 3 is a cross-sectional view illustrating an example configuration of an LED package. The LED package is connected to a substrate by using the anisotropic conductive adhesive comprising an adhesive agent material in which the conductive particles and the solder particles are dispersed.

The LED device comprises a device substrate 11 made of sapphire and several layers formed thereon including, for example, a first conductive cladding layer 12 made of n-GaN, an active layer 13 made of $In_xAl_yGa_{1-x-y}N$, and a second conductive cladding layer 14 made of p-GaN, thus forming a so-called double heterostructure. Additionally, a first conductive electrode 12a is formed on a part of the first conductive cladding layer 12 and a second conductive electrode 14a is formed on a part of the second conductive cladding layer 14. If voltage is applied across the first conductive electrode 12a and the second conductive electrode 14a of the LED device, carriers are concentrated in the active layer 13 and light is generated due to recoupling.

The substrate includes a substrate material 21, a first conductive circuit pattern 22 and a second conductive circuit pattern 23 formed on the substrate material 21, and electrodes 22a and 23a formed at positions corresponding to the first and second conductive electrodes 12a and 14a of an LED device respectively.

The anisotropic conductive adhesive includes, as previously mentioned, the conductive particles 31 and the solder particles 32 dispersed in the binder 33.

As illustrated in FIG. 3, in the LED package, terminals of the LED device (conductive electrodes 12a, 14a) and terminals of the substrate (conductive electrodes 22a, 23a) are electrically connected via the conductive particles, and the terminals of the LED device and terminals of the substrate are bonded by solder bonding.

Thus, it is possible for heat generated by the active layer 13 of the LED device to be efficiently dissipated towards the substrate side and, along with preventing a loss of light-production efficiency, life of the LED package can be prolonged. Furthermore, by being an achromatic white or gray, the solder particles 32 can reflect light from the active layer 13 to achieve a high luminance.

Figure 4:
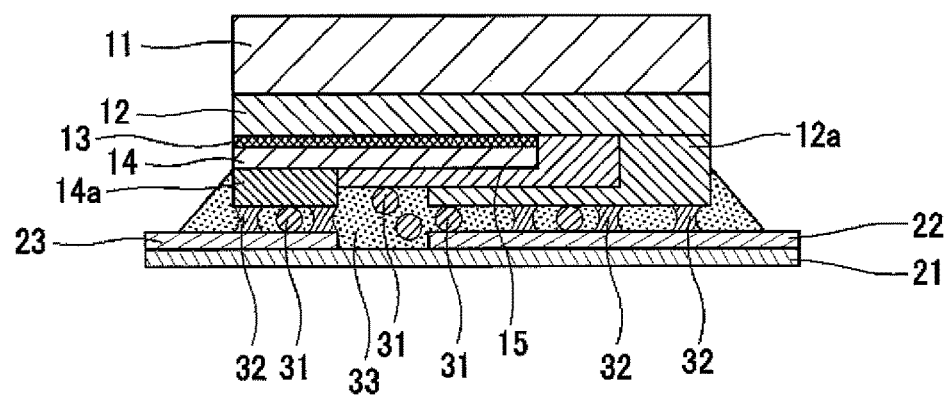
FIG. 4 is a cross-sectional view of another example of an LED package according to one embodiment of the present invention.

Additionally, as illustrated in FIG. 4, because terminals of the LED device (electrodes 12a, 14a) in a flip-chip-mounting LED are designed to be large, with the passivation layer 15, larger amounts of the conductive particles and the solder particles can be trapped in the interval between the terminals of the LED device (electrodes 12a, 14a) and the terminals of the substrate (circuit patterns 22, 23 ). Thus, heat generated at the active layer 13 of the LED device can be dissipated to the substrate more efficiently.

Next, a manufacturing method of the connective structure will be explained. The package manufacturing method according to this embodiment is a package manufacturing method wherein the conductive particles and the solder particles, which have a smaller average diameter in comparison to the conductive particles, are dispersed in an adhesive agent material to make an anisotropic conductive adhesive which is held between the terminal of the first electronic component and the terminal of a second electronic component, and the first electronic component and the second electronic component are thermally compressed.

Thus, the terminal of the first electronic component and the terminal of the second electronic component are electrically connected via the conductive particles to form a connective structure wherein the first electronic component and the terminal of the second electronic component are solder bonded.

In the manufacturing method according to this embodiment, during crimping, the conductive particles undergo a flattening deformation due to pressure, the solder particles are crushed at the same time and form a metallic bond due to heat induced solder bonding thereby increasing opposing terminal contact surface area thus enabling high heat dissipation and high reliability properties. Additionally, as resin cores of the conductive particles mitigate stress generated by different amounts of thermal expansion in a substrate and a device, cracks in solder bonded parts can be suppressed.

Examples

<3. Examples>

In the following, examples of the present invention will be described in detail; however, these examples do not limit the scope of the present invention.

In the following experiments, an anisotropic conductive adhesive in the form of an anisotropic conductive paste (ACP) and an LED package were manufactured, and heat dissipation properties, adhesive properties, and electrical properties thereof were evaluated.

Manufacturing of the anisotropic conductive adhesive and LED package, and evaluation of heat dissipation properties, adhesive properties, and electrical properties of the LED package where performed in the following manner.

[Manufacturing of the Anisotropic Conductive Adhesive]

Conductive particles (product name: AUL705 manufactured by Sekisui Chemical Co., Ltd.) comprised of cross-linked polystyrene particles having an average diameter (D50) of 5 μm and having a gold coating applied to the surface thereof, and solder particles (product name: M707, manufactured by Senju Metal Industry Co., Ltd.) Having an average diameter of 5 μm were dispersed in a mixture of a curable epoxy adhesive agent (epoxy resin (product name: CELL2021P, manufactured by Daicel Corporation) and acid anhydride (MeHHPA, product name: MH700, manufactured by New Japan Chemical Co., Ltd.) to manufacture an anisotropic conductive adhesive having a heat conductive property.

[Manufacturing of the LED Package]

A flip-chip-mounting LED chip (product name: DA700, manufactured by Cree. Inc., Vf=3.2 V (If=350 mA)) was mounted to an Au electrode substrate (ceramic substrate with a conductor space of 100 μmP and a Ni/Au plating with a thickness of 5.0/0.3 μm) by using the anisotropic conductive adhesive. The anisotropic conductive adhesive was applied to an Au substrate terminal, the LED package was aligned, installed and thermal compression was performed with conditions of a load of 1000 g per chip and a temperature of 150° C. for 10 seconds followed by a temperature of 230° C. for 30 seconds.

[Evaluation of Heat Dissipation Properties]

By using a transient thermal resistance measuring device (manufactured by CATS Inc.), thermal resistance (° C./W) of the LED package was measured. Measurements were performed with a forward current (If) of 350mA (constant current control).

[Evaluation of Adhesive Properties]

By using a die shear tester (PTR-1100 manufactured by Rhesca Co., Ltd.), adhesive strength in the LED package was measured.

[Evaluation of Electrical Properties]

A measurement taken with a forward current (If) of 350 mA was used as the initial forward voltage (Vf) value. Furthermore, the LED package was lit for 500 hours under conditions of a temperature of 85° C. and a relative humidity of 85% (high temperature and high humidity test); forward voltage (Vf) was measured with a forward current (If) of 350 mA. Additionally, the LED package was subjected to a thermal shock test wherein the LED package was subjected to 3000 cycles of a temperature of −40° C. for 30 minutes and a temperature of 100° C. for 30 minutes to measure Vf value for If =350 mA.

In evaluation of the high temperature and high humidity test and the thermal shock test, cases in which a break in conduction (open) was confirmed were evaluated as failing (hereinafter represented as "F") and otherwise as passing (hereinafter represented as "P"). Furthermore, in evaluation of the high temperature and high humidity test and the thermal shock test, cases in which a break in conduction (open) were evaluated as F and cases in which forward voltage (Vf) was observed to be 5% or lower than the initial forward voltage (Vf) value were evaluated as short circuit (hereinafter represented as "S") and cases in which there was less than 5% variance in forward voltage (Vf) were evaluated as P.

Example 1

A mixture of the conductive particles at 8% by volume and the solder particles at 2% by volume were dispersed in the epoxy composition to manufacture an anisotropic conductive adhesive with a heat conductive property. Results of measuring an LED package manufactured using this anisotropic conductive adhesive were a thermal resistance of 21.0° C./W and a die shear strength of 26 N/chip. Additionally, electrical properties evaluation results in the high temperature and high humidity tests were P for the initial and P for the final measurements and electrical properties evaluation results in the thermal shock test were P for the initial and P for the final measurements.

Example 2

A mixture of the conductive particles at 5% by volume and the solder particles at 5% by volume were blended in an epoxy composition to manufacture an anisotropic conductive adhesive with a heat conductive property. Results of measuring an LED package manufactured using this anisotropic conductive adhesive were a thermal resistance of 13.2° C./W and a die shear strength of 37 N/chip. Additionally, electrical properties evaluation results in the high temperature and high humidity tests were P for the initial and P for the final measurements and electrical properties evaluation results in the thermal shock test were P for the initial and P for the final measurements.

Example 3

A mixture of the conductive particles at 2% by volume and the solder particles at 8% by volume were blended in an epoxy composition to manufacture an anisotropic conductive adhesive with a heat conductive property. Results of measuring an LED package manufactured using this anisotropic conductive adhesive were a thermal resistance of 12.2° C./W and a die shear strength of 45 N/chip. Additionally, electrical properties evaluation results in the high temperature and high humidity tests were P for the initial and P for the final measurements and electrical properties evaluation results in the thermal shock test were P for the initial and P for the final measurements.

Example 4

A mixture of the conductive particles at 2% by volume and the solder particles at 20% by volume were blended in an epoxy composition to manufacture an anisotropic conductive adhesive with a heat conductive property. Results of measuring an LED package manufactured using this anisotropic conductive adhesive were a thermal resistance of 10.4° C./W and a die shear strength of 52 N/chip. Additionally, electrical properties evaluation results in the high temperature and high humidity tests were P for the initial and P for the final measurements and electrical properties evaluation results in the thermal shock test were P for the initial and P for the final measurements.

Example 5

A mixture of the conductive particles at 1% by volume, the solder particles at 30% by volume were blended in an epoxy composition to manufacture an anisotropic conductive adhesive with a heat conductive property. Results of measuring an LED package manufactured using this anisotropic conductive adhesive were a thermal resistance of 10.0° C./W and a die shear strength of 54 N/chip. Additionally, electrical properties evaluation results in the high temperature and high humidity tests were P for the initial and P for the final measurements and electrical properties evaluation results in the thermal shock test were P for the initial and P for the final measurements.

Example 6

A mixture of the conductive particles at 30% by volume and the solder particles at 1% by volume were blended in an epoxy composition to manufacture an anisotropic conductive adhesive with a heat conductive property. Results of measuring an LED package manufactured using this anisotropic conductive adhesive were a thermal resistance of 31.9° C./W and a die shear strength of 21 N/chip. Additionally, electrical properties evaluation results in the high temperature and high humidity tests were P for the initial and P for the final measurements and electrical properties evaluation results in the thermal shock test were P for the initial and P for the final measurements.

Comparative Example 1

Only the solder particles at 10% by volume were blended in an epoxy composition without conductive particles to manufacture an anisotropic conductive adhesive with a heat conductive property. Results of measuring an LED package manufactured using this anisotropic conductive adhesive were a thermal resistance of 11.8° C./W and a die shear strength of 48 N/chip. Additionally, electrical properties evaluation results in the high temperature and high humidity tests were P for the initial and P for the final measurements and electrical properties evaluation results in the thermal shock test were P for the initial and F for the final measurements.

Comparative Example 2

Only the conductive particles at 5% by volume were blended in an epoxy composition without solder particles to manufacture an anisotropic conductive adhesive with a heat conductive property. Results of measuring an LED package manufactured using this anisotropic conductive adhesive were a thermal resistance of 40.0° C./W and a die shear strength of 15 N/chip. Additionally, electrical properties evaluation results in the high temperature and high humidity tests were P for the initial and P for the final measurements and electrical properties evaluation results in the thermal shock test were P for the initial and P for the final measurements.

Comparative Example 3

Only the solder particles at 40% by volume were blended in an epoxy composition without conductive particles to manufacture an anisotropic conductive adhesive with a heat conductive property. Die shear strength of an LED package manufactured using this anisotropic conductive was measured to be 55 N/chip. Additionally, electrical properties evaluations resulted in S for the initial measurement of the high temperature and high humidity test and S for the initial measurement of the thermal shock test.

Comparative Example 4

Only the conductive particles at 40% by volume were blended in an epoxy composition without solder particles to manufacture an anisotropic conductive adhesive with a heat conductive property. Die shear strength of an LED package manufactured using this anisotropic conductive was measured to be 15 N/chip. Additionally, electrical properties evaluations resulted in S for the initial measurement of the high temperature and high humidity test and S for the initial measurement of the thermal shock test.

Figure 5:
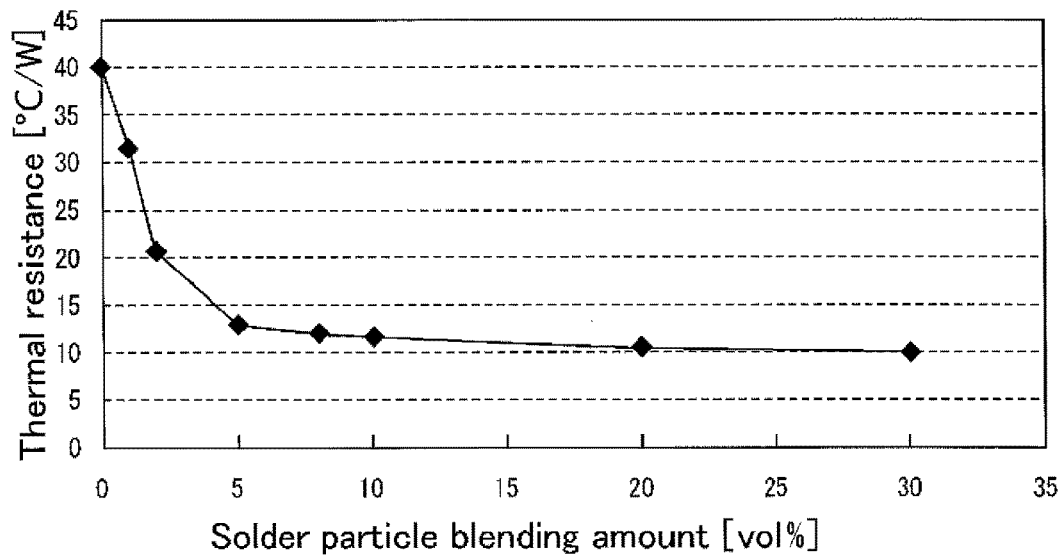
FIG. 5 is a graph illustrating the relationship between blending amount of solder particles and thermal resistance.
Figure 6:
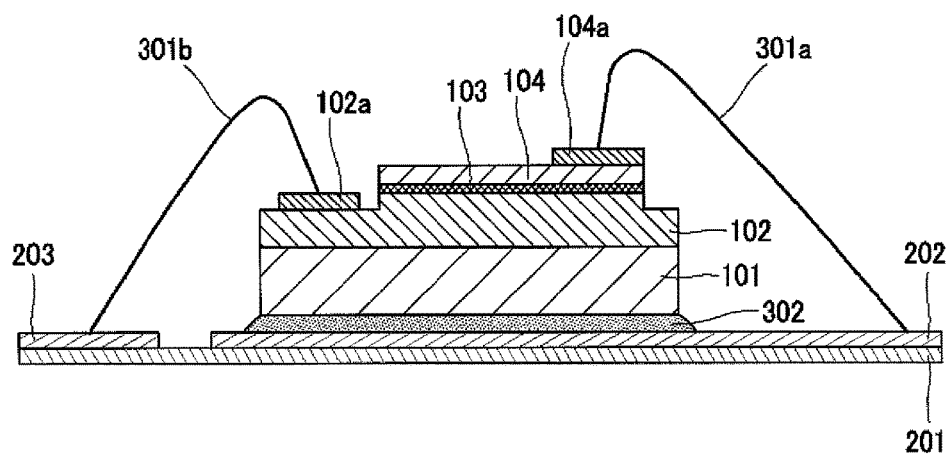
FIG. 6 is a cross-sectional view of an example LED package manufactured using a wire bonding method.
Figure 7:
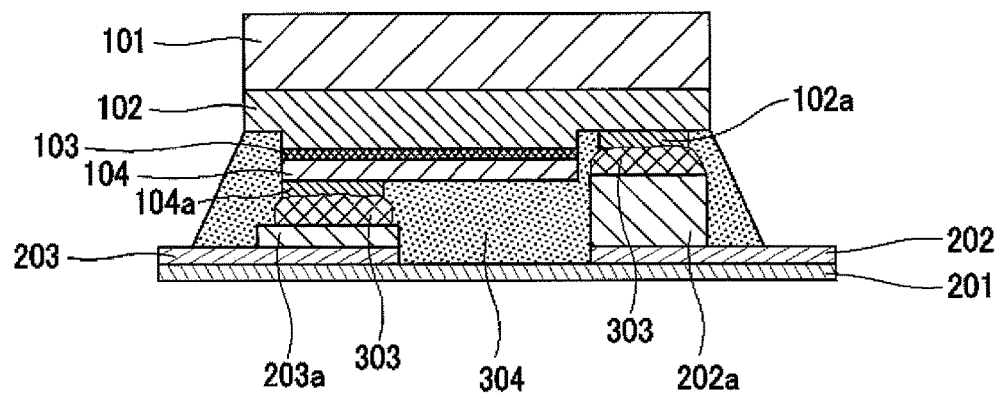
FIG. 7 is a cross-sectional view of an example of an LED package manufactured using conductive paste.
Figure 8:
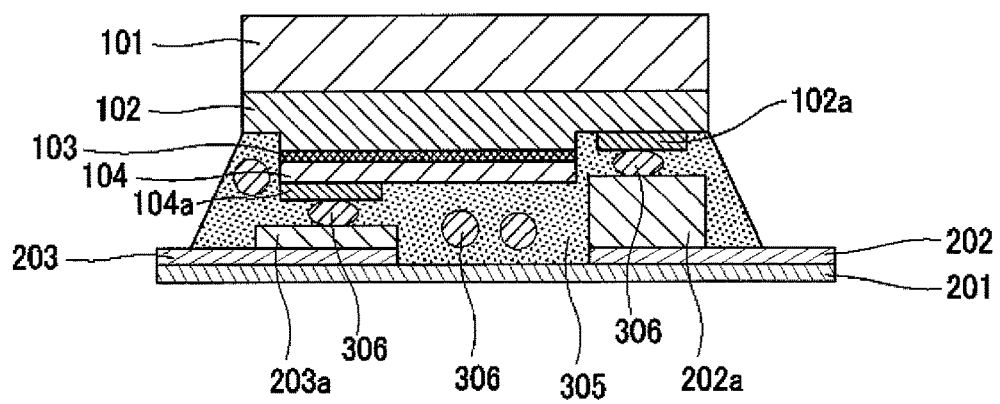
FIG. 8 is a cross-sectional view of an example of an LED package manufactured using an anisotropic conductive adhesive.
Figure 9:
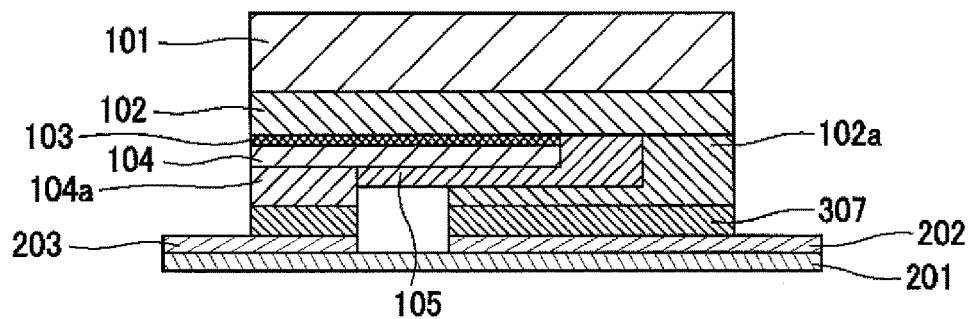
FIG. 9 is a cross-sectional view of an LED package manufactured by mounting a flip-chip-mounting LED device using gold-tin eutectic bonding.
Figure 10:
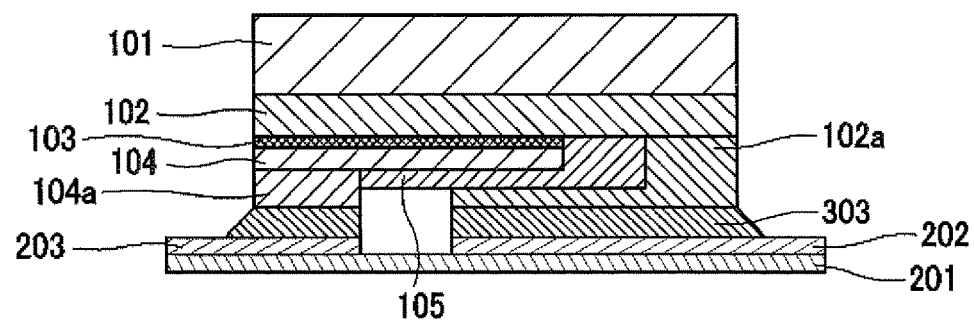
FIG. 10 is a cross-sectional view of an example of an LED package manufactured by mounting a flip-chip-mounting LED device using a silver paste.
Figure 11:
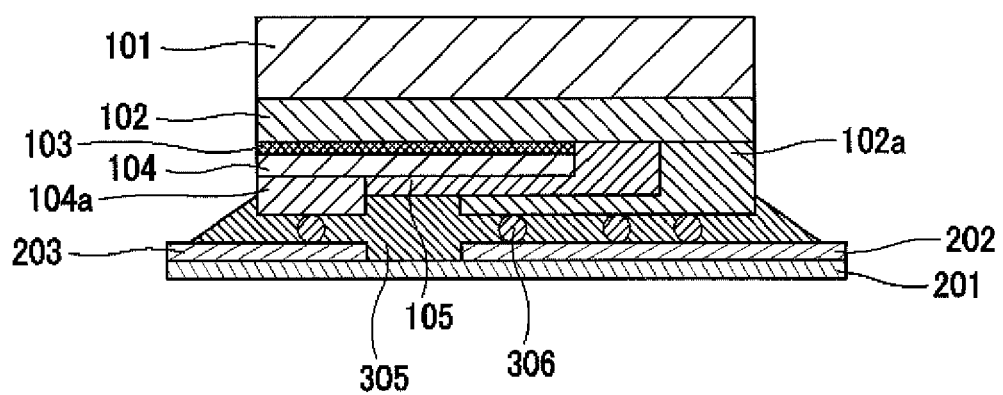
FIG. 11 is a cross-sectional view of an example of an LED package manufactured by mounting a flip-chip-mounting LED device using an anisotropic conductive adhesive.

The results of examples 1 to 6 are given in table 1 and the results of comparative examples 1 to 4 are given in table 2. Additionally, FIG. 5 illustrates thermal resistance in relation to blending amount of solder particles. FIG. 5 is a graph in which blending amount of solder particles in the examples 1 to 6 and the comparative examples 1 and 2 are plotted against thermal resistance.

TABLE 1

|  |  |  | Ex. 1 | Ex. 2 | Ex. 3 | Ex. 4 | Ex. 5 | Ex. 6 |
|---|---|---|---|---|---|---|---|---|
| Conductive particle | Blending amount |  | 8 | 5 | 2 | 2 | 1 | 30 |
| Solder particle | (vol %) |  | 2 | 5 | 8 | 20 | 30 | 1 |
| Heat dissipation property | Thermal resistance (° C./W) |  | 21.0 | 13.2 | 12.2 | 10.4 | 10.0 | 31.9 |
| Adhesive property | Die shear strength (N/chip) |  | 26 | 37 | 45 | 52 | 54 | 21 |
| Electrical property | 85° C. 85% RH lighting | Initial | P | P | P | P | P | P |
|  |  | 500 h | P | P | P | P | P | P |
|  | TCT −40° C.↔ 100° C. | Initial | P | P | P | P | P | P |
|  |  | 3000 cycle | P | P | P | P | P | P |

TABLE 2

|  |  |  | Com. 1 | Com. 2 | Com. 3 | Com. 4 |
|---|---|---|---|---|---|---|
| Conductive particle | Blending amount |  | 0 | 8 | 0 | 40 |
| Solder particle | (vol %) |  | 10 | 0 | 40 | 0 |
| Heat dissipation property | Thermal resistance (° C./W) |  | 11.8 | 40.0 | — | — |
| Adhesive property | Die shear strength (N/chip) |  | 48 | 15 | 55 | 15 |
| Electrical property | 85° C. 85% RH lighting | Initial | P | P | S | S |
|  |  | 500 h | P | P | — | — |
|  | TCT −40° C.↔ 100° C. | Initial | P | P | S | S |
|  |  | 3000 cycle | F | P | — | — |

As can be seen from the example 1, in an LED package manufactured using an anisotropic conductive adhesive which includes the conductive particles at 8% by volume and the solder particles at 2% by volume in proportion to the binder resin, thermal resistance is 21.0 (° C./W) and it is possible to achieve a thermal resistance value lower than that of the comparative example 2, to which solder particles were not added, and thus the heat dissipation properties in the LED package were improved. Additionally, die shear strength was 26 N/chip which is an improvement in comparison with comparative example 2. Furthermore, under conditions of 85° C. at 85% relative humidity (RH) for 500 hours during the lighting reliability test (high temperature and high humidity test), reliability of electrical connections was favorable.

As can be seen from the example 2, in an LED package manufactured using an anisotropic conductive adhesive which includes the conductive particles at 5% by volume and the solder particles at 5% by volume in proportion to the binder resin, thermal resistance is 13.2 (° C./W) and it is possible to achieve a thermal resistance value lower than that of the comparative example 2, to which solder particles were not added, and thus the heat dissipation properties in the LED package were improved. Additionally, die shear strength was 37 N/chip which is an improvement in comparison with comparative example 2. Furthermore, under conditions of 85° C. at 85% relative humidity (RH) for 500 hours during the lighting reliability test, reliability of electrical connections was favorable. Additionally, after being subjected to 3000 cycles in the thermal shock test, reliability of electrical connections was favorable.

As can be seen from the example 3, in an LED package manufactured using an anisotropic conductive adhesive which includes the conductive particles at 2% by volume and the solder particles at 8% by volume in proportion to the binder resin, thermal resistance is 12.2 (° C./W) and it is possible to achieve a thermal resistance value lower than that of the comparative example 2, to which solder particles were not added, and thus the heat dissipation properties in the LED package were improved. Additionally, die shear strength was 45 N/chip which is an improvement in comparison with comparative example 2. Furthermore, under conditions of 85° C. at 85% relative humidity (RH) for 500 hours during the lighting reliability test, reliability of electrical connections was favorable. Additionally, after being subjected to 3000 cycles in the thermal shock test, reliability of electrical connections was favorable.

As can be seen from the example 4, in an LED package manufactured using an anisotropic conductive adhesive which includes the conductive particles at 2% by volume and the solder particles at 20% by volume in proportion to the binder resin, thermal resistance is 10.4 (° C./W) and it is possible to achieve a thermal resistance value lower than that the comparative example 2, to which the solder particles were not added, and thus the heat dissipation properties in the LED package were improved. Additionally, die shear strength was 52 N/chip which is an improvement in comparison with comparative example 2. Furthermore, under conditions of 85° C. at 85% relative humidity (RH) for 500 hours during the lighting reliability test, reliability of electrical connections was favorable. Additionally, after being subjected to 3000 cycles in the thermal shock test, reliability of electrical connections was favorable.

As can be seen from the example 5, in an LED package manufactured using an anisotropic conductive adhesive which includes the conductive particles at 1% by volume and the solder particles at 30% by volume in proportion to the binder resin, thermal resistance is 10.0 (° C./W) and it is possible to achieve a thermal resistance value lower than that of the comparative example 2, to which solder particles were not added, and thus the heat dissipation properties in the LED package were improved. Additionally, die shear strength was 54 N/chip which is an improvement in comparison with comparative example 2. Furthermore, under conditions of 85° C. at 85% relative humidity (RH) for 500 hours during the lighting reliability test, reliability of electrical connections was favorable. Additionally, after being subjected to 3000 cycles in the thermal shock test, reliability of electrical connections was favorable.

As can be seen from the example 6, in an LED package manufactured using an anisotropic conductive adhesive which includes the conductive particles at 30% by volume and the solder particles at 1% by volume in proportion to the binder resin, thermal resistance is 31.9 (° C./W) and it is possible to achieve a thermal resistance value lower than that of the comparative example 2, to which solder particles were not added, and thus the heat dissipation properties in the LED package were improved. Additionally, die shear strength was 21 N/chip which is an improvement in comparison with comparative example 2. Furthermore, under conditions of 85° C. at 85% relative humidity (RH) for 500 hours during the lighting reliability test, reliability of electrical connections was favorable. Additionally, after being subjected to 3000 cycles in the thermal shock test, reliability of electrical connections was favorable.

As can be seen from the comparative example 1, in an LED package manufactured using an anisotropic conductive adhesive which does not include the conductive particles and includes the solder particles at 10% by volume in proportion to the binder resin, thermal resistance is 11.8 (° C./W) and it is possible to achieve a thermal resistance value lower than that of the comparative example 2, to which solder particles were not added, and thus the heat dissipation properties in the LED package were improved. Additionally, die shear strength was 48 N/chip which is an improvement in comparison with comparative example 2. Furthermore, under conditions of 85° C. at 85% relative humidity (RH) for 500 hours during the lighting reliability test, reliability of electrical connections was also favorable. However, after being subjected to 3000 cycles in the thermal shock test, cracks had formed in solder bonded parts and an electrical short had occurred, thus favorable reliability of electrical connections was not achieved.

As can be seen from the comparative example 2, in an LED package manufactured using an anisotropic conductive adhesive which includes the conductive particles at 8% by volume in proportion to the binder resin and does not include the solder particles, under conditions of 85° C. at 85% relative humidity (RH) for 500 hours during the lighting reliability test, reliability of electrical connections was favorable. Additionally, after being subjected to 3000 cycles in the thermal shock test, reliability of electrical connections was favorable. However, die shear strength was 15 N/chip, which is low. Additionally, thermal resistance was 40.0 (° C./W) and it was not possible to achieve favorable heat dissipation properties.

As can be seen from the comparative example 3, in a sample LED package manufactured using an anisotropic conductive adhesive which does not include the conductive particles and includes the solder particles at 40% by volume in proportion to the binder resin, die shear strength was 55 N/chip but anisotropic properties were lost due to excessive inclusion of the solder particles. Because of this, a short circuit was generated in the initial test.

As can be seen from the comparative example 4, in an LED package manufactured using an anisotropic conductive adhesive which includes the conductive particles at 40% by volume in proportion to the binder resin and does not include the solder particles, die shear strength was 15 N/chip, which is low. Additionally, anisotropic properties were lost due to excessive inclusion of the conductive particles. Because of this, a short circuit was generated in the initial test.

As described above, by using solder particles and conductive particles together in an anisotropic conductive adhesive, it is possible to impart a high heat dissipation property to an LED package and obtain an anisotropic conductive adhesive with a high connection reliability.

EXPLANATION OF REFERENCES

11 device substrate, 12 first conductive cladding layer, 13 active layer, 14 second conductive cladding layer, 22 first conductive circuit pattern, 23 second conductive circuit pattern, 15 passivation layer, 31 conductive particles, 32 solder particles, 33 binder, 101 device substrate, 102 first conductive cladding layer, 103 active layer, 104 second conductive cladding layer, 105 passivation layer, 201 substrate, 202 first conductive circuit pattern, 203 second conductive circuit pattern, 301 wire bond, 302 die bond material, 303 conductive paste, 304 sealing resin, 305 binder, 306 conductive particles, 307 gold-tin alloy.

The invention claimed is:

1. An anisotropic conductive adhesive for electrical connection of a terminal of a first electric component and a terminal of a second electric component, the anisotropic conductive adhesive comprising:
    1% to 5% by volume of conductive particles, each being a resin particle having a conductive metallic layer formed on the surface thereof;
    5% to 30% by volume of solder particles having an average diameter smaller than that of the conductive particles; and
    an adhesive agent material in which the conductive particles and the solder particles are dispersed.

2. The anisotropic conductive adhesive according to claim 1, wherein the solder particles have an average diameter of at least 25% of that of the conductive particles.

3. A connective structure between a terminal of a first electronic component and a terminal of a second electronic component being electrically connected with each other with an anisotropic conductive adhesive therebetween, the anisotropic conductive adhesive including:
  conductive particles at 1% to 5% by volume, each being a resin particle having a conductive metallic layer formed on the surface thereof; and
  solder particles at 5% to 30% by volume, having an average diameter smaller than that of the conductive particles,
  wherein the terminal of the first electronic component and the terminal of the second electronic component are electrically connected to each other by the conductive particles undergoing flattening deformation, and the terminals are solder bonded.

4. The connective structure according to claim 3, wherein the first electronic component is an LED device; and
  the second electronic component is a substrate.

5. The connective structure of claim 3, wherein the solder particles have an average diameter of at least 25% of that of the conductive particles.

\* \* \* \* \*